United States Patent
Shen

(10) Patent No.: US 9,121,867 B2
(45) Date of Patent: Sep. 1, 2015

(54) SENSOR AND TRANSPORTING DEVICE INCLUDING THE SAME

(71) Applicant: HON HAI PRECISION INDUSTRY CO., LTD., New Taipei (TW)

(72) Inventor: Chao Shen, Shenzhen (CN)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 184 days.

(21) Appl. No.: 13/903,076

(22) Filed: May 28, 2013

(65) Prior Publication Data

US 2013/0321017 A1    Dec. 5, 2013

(30) Foreign Application Priority Data

Jun. 4, 2012    (CN) .................... 2012 2 0259221 U

(51) Int. Cl.
- *G01R 1/067*   (2006.01)
- *H05K 13/00*   (2006.01)
- *B25J 9/00*    (2006.01)
- *B23Q 1/00*    (2006.01)
- *G05B 19/402*  (2006.01)

(52) U.S. Cl.
CPC  *G01R 1/067* (2013.01); *B23Q 1/00* (2013.01); *B25J 9/00* (2013.01); *G05B 19/402* (2013.01); *H05K 13/0015* (2013.01)

(58) Field of Classification Search
USPC ............. 324/750.13, 750.16, 750.17, 750.22, 324/602, 609, 635, 644, 658, 662, 663, 671, 324/699, 716, 755.01; 269/45; 224/310, 224/405; 29/739
See application file for complete search history.

(56) References Cited

U.S. PATENT DOCUMENTS

2005/0150099 A1*  7/2005  Arita et al. ................. 29/525.01
2012/0119770 A1*  5/2012  Baekbo et al. ........... 324/750.22

\* cited by examiner

*Primary Examiner* — Vinh Nguyen
*Assistant Examiner* — Nasima Monsur
(74) *Attorney, Agent, or Firm* — Novak Druce Connolly Bove + Quigg LLP

(57) ABSTRACT

A sensor detects a workpiece ready for transportation by means of an outwardly hanging contact arm which, when the workpiece is dropped or placed on a carrying frame, is pushed back into a groove in the body of the sensor and in that location gives a contact signal to start the transport, avoiding damage to the hanging arm or to its mechanism otherwise caused by the continuing weight or impact of the dropped or placed workpiece.

13 Claims, 4 Drawing Sheets

100 # SENSOR AND TRANSPORTING DEVICE INCLUDING THE SAME

BACKGROUND

1. Technical Field

The present disclosure relates to sensors, and particularly to a sensor used for a transporting device and the transporting device including the sensor.

2. Description of the Related Art

An intelligent transporting device includes a driving member, a catcher frame, a sensor, and a controller. The catcher frame is connected to and driven by the driving member. The sensor is mounted on the catcher frame. The controller is electrically connected to the sensor and the driving member. The sensor includes a mounting seat and an electrode mounted on the mounting seat. When a workpiece is placed or dropped on the catcher frame, the electrode contacts the workpiece, and a detecting signal is transmitted to the controller by the sensor, such that the workpiece is transported by the driving member, which is controlled by the controller. However, the electrode is easily damaged by the workpiece, and the sensor thereby stops working. Thus, transport efficiency is adversely affected.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views.

DETAILED DESCRIPTION

Figure 1:
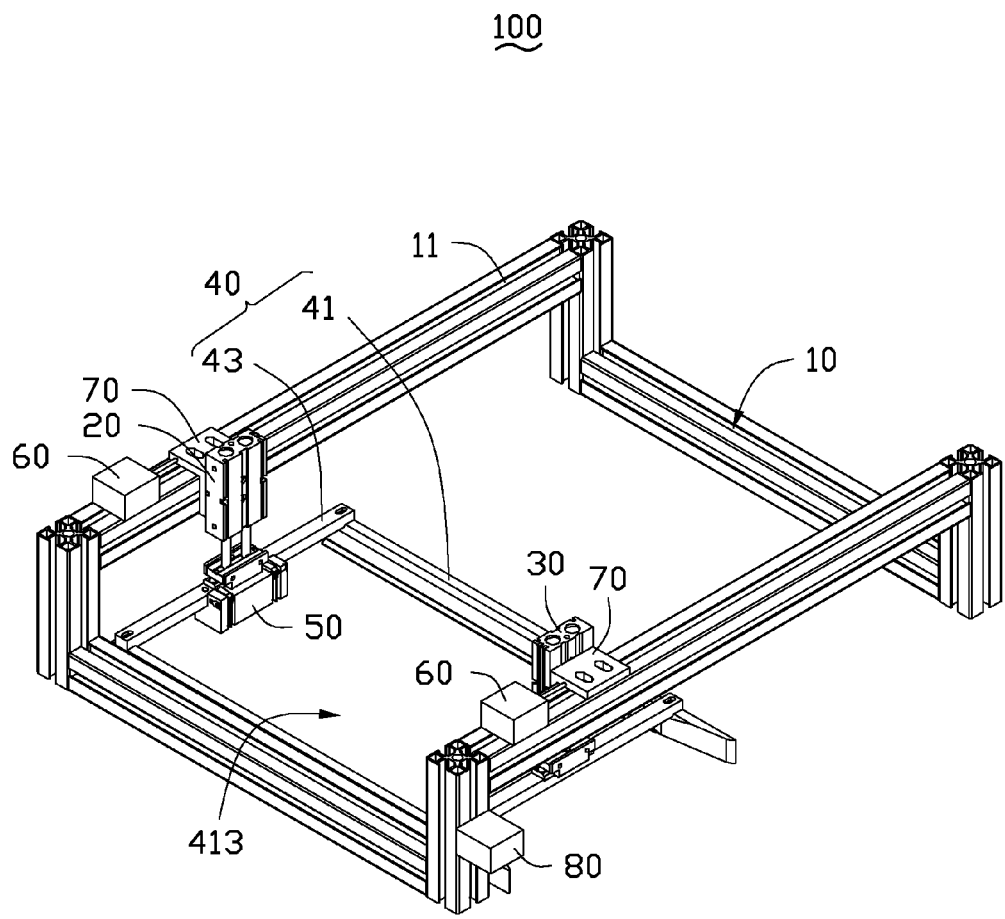
FIG. 1 is an assembled, isometric view of a transporting device of one embodiment, including a sensor.
Figure 2:
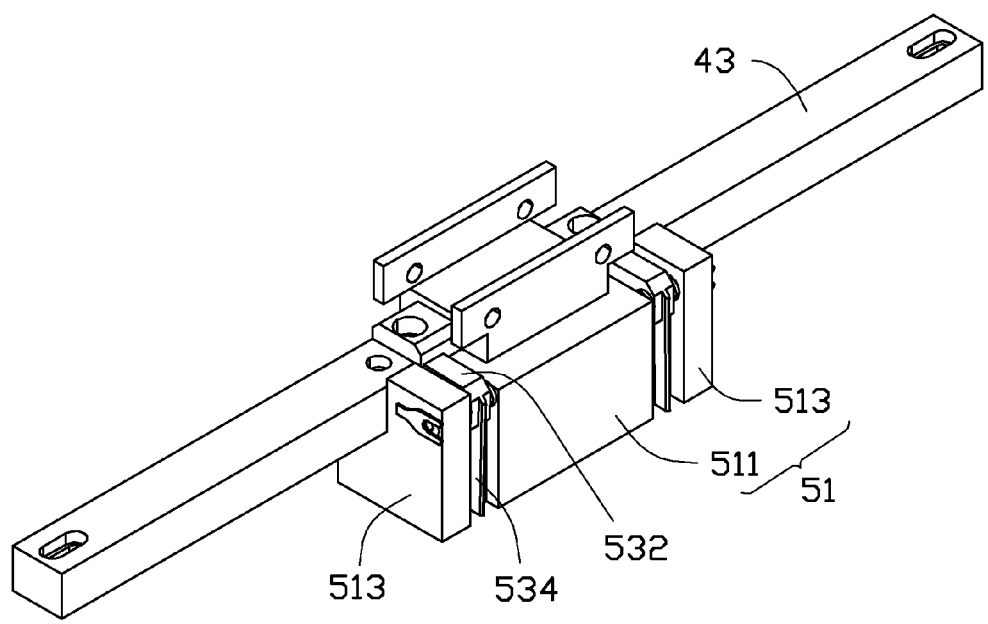
FIG. 2 is an assembled, isometric view of the sensor in FIG. 1.
Figure 4:
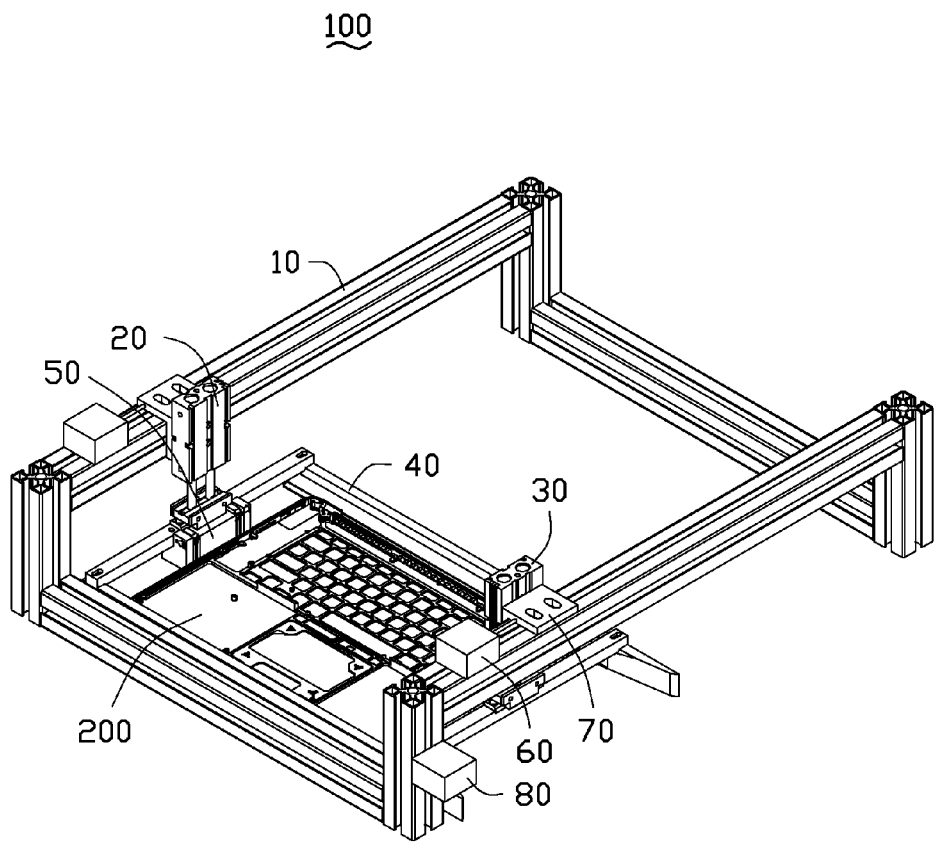
FIG. 4 shows a working state of the transporting device of FIG. 1.

FIG. 1 shows an embodiment of a transporting device 100. FIG. 4 shows a working state of the transporting device 100 for transporting one or more workpiece 200 to a predetermined position. The transporting device 100 includes a mounting seat 10, a first vertically driving member 20, a second vertically driving member 30, two horizontally driving members 60, a catcher frame 40, a sensor 50, a controller 80, and two sliding seats 70 slidably mounted on the mounting seat 10. The first, second vertically driving members 20, 30 are mounted on the two sliding seats 70, respectively, and are connected to the two horizontally driving members 60, respectively. The two horizontally driving members 60 are mounted on the mounting seat 10, for driving the two sliding seats 70 to a predetermined location. The catcher frame 40 is connected to the first, second vertically driving members 20, 30. The sensor 50 is mounted on the catcher frame 40 and detects the workpiece 200. The controller 80 is electrically connected to the first vertically driving member 20, the second vertically driving member 30, the sensor 50, and the two horizontally driving members 60. When the controller 80 receives a signal transmitted by the sensor 50, the first vertically driving member 20, the second vertically driving member 30, and the two horizontally driving members 60 start moving, to transport the workpiece 200.

The mounting seat 10 is substantially rectangular and frame-like. The mounting seat 10 includes two sliding rods 11 located opposite to each other.

Each sliding seat 70 is substantially L-shaped, and is slidably mounted on one sliding rod 11. Each horizontally driving member 60 is mounted on one sliding rod 11, and is connected to one sliding seat 70, for driving the sliding seat 70 to slide along the sliding rod 11. Each of the first vertically driving member 20 and the second vertically driving member 30 are mounted on one sliding seat 70, respectively. In an illustrated embodiment, the first vertically driving member 20, the second vertically driving member 30, and the two horizontally driving members 60 are cylinders.

The catcher frame 40 is substantially rectangular and frame-like. The catcher frame 40 includes two opposite support bars 41 and two opposite connection bars 43. The two support bars 41 and the two connection bars 43 are connected to each other in an end-to-end configuration, and cooperatively define a support space 413 to support, capture, or catch the workpiece 200. The two connection bars 43 are connected to the first vertically driving member 20 and the second vertically driving member 30, to vertically drive the catcher frame 40.

Figure 3:
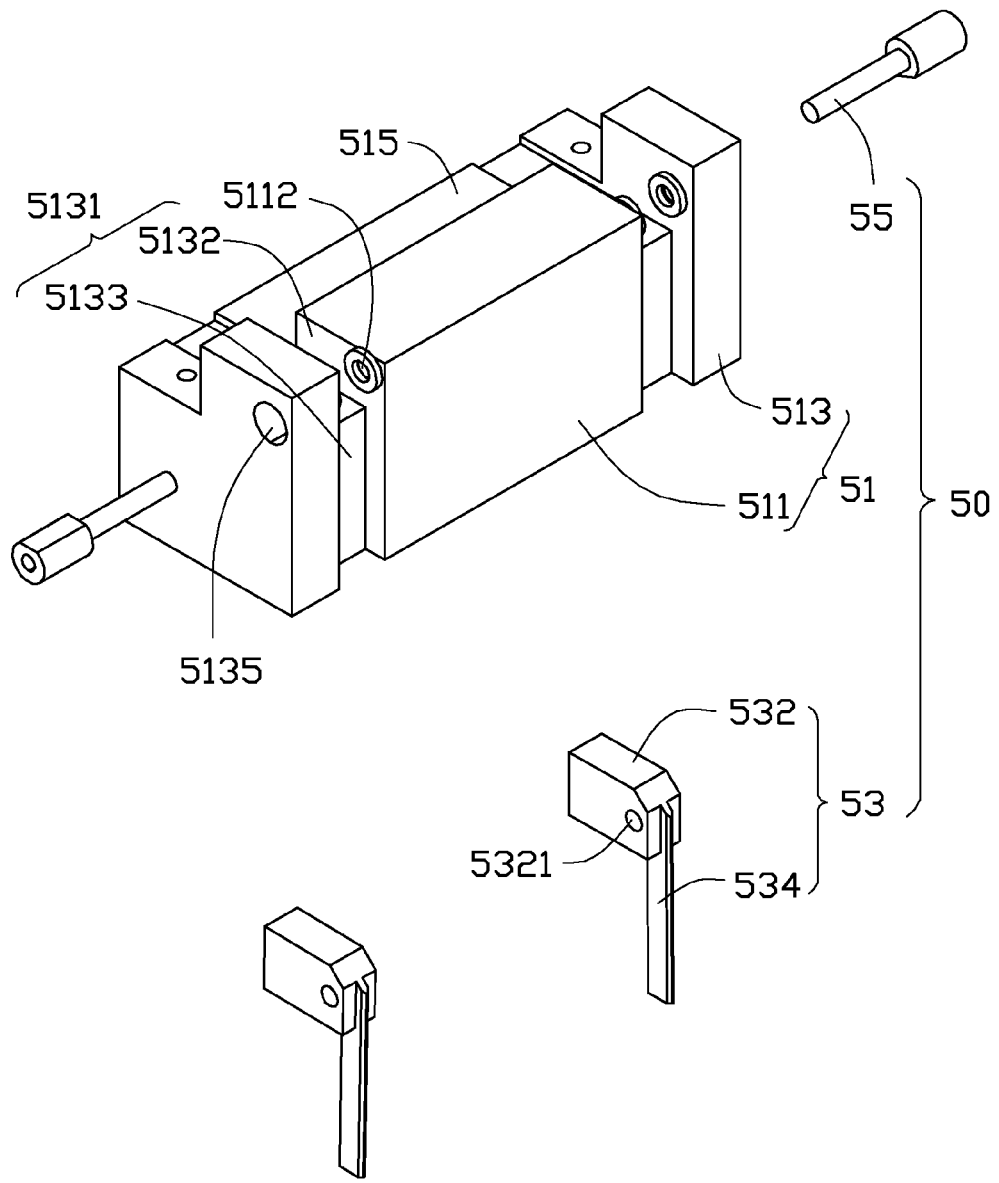
FIG. 3 is an exploded, isometric view of the sensor in FIG. 2.

FIGS. 3 and 4 show the sensor 50 in detail. The sensor 50 is mounted on one of the two connection bars 43 below the first vertically driving member 20. The sensor 50 includes a mounting body 51, two electrodes 53, and two connection members 55. The two electrodes 53 are movably mounted on the mounting body 51 by the connection members 55, respectively. The mounting body 51 includes a main portion 511 and two mounting portions 513 formed on opposite ends of the main portion 511. A connection portion 515 is formed on a side of the main body 511 and the mounting portion 513. The connection portion 515, the main body 511 and the mounting portion 513 cooperatively form a stepped structure for mounting the connection bar 43. A mounting groove 5131 is defined in an adjoining portion between each mounting portion 513 and the main body 511. The mounting groove 5131 is substantially L-shaped, and includes a first groove 5132 extending toward the connection portion 515 and a second groove 5133 substantially perpendicularly communicating with one end of the first groove 5132 away from the connection portion 515. A connection hole 5112 is defined in a corner of each side surface of the main portion 511 communicating with the first groove 5132. A mounting hole 5135 is defined in each mounting portion 513 communicating with the first groove 5132. The mounting hole 5135 and the connection hole 5112 are coaxial, and opposite to each other. The two electrodes 53 are mounted on the mounting body 51. Each electrode 53 includes a hinge portion 532 and a contacting portion 534 extending from the hinge portion 532. The hinge portion 532 is block-like, and is movably mounted in the first groove 5132. A hinge hole 5321 is defined in a corner of the hinge portion 532 adjacent to the contacting portion 534. The contacting portion 534 is bar-like, and is mounted in the second groove 5133. Each connection member 55 passes through the mounting hole 5135 and the hinge hole 5321, and then is fixed in the connection hole 5112, such that each electrode 53 is rotatably connected to the mounting body 51. A center of gravity of the hinge portion 532 is positioned on a side thereof away from the hinge hole 5321 and the contacting portion 534, such that the contacting portion 534 protrudes from the second groove 5133.

In assembly, first, each electrode 53 is rotatably connected to the mounting body 51 by one connection member 55.

Second, the connection portion 515 is fixed to one connection bar 43, such that the sensor 50 is fixed to the catcher frame 40. Third, the catcher frame 40 with the sensor 50 is mounted on the mounting seat 10, the sliding seats 70 are slidably mounted on the sliding rods 11, and the two horizontally driving members 60 are mounted on the two sliding rods 11 and connected to the two sliding seats 70. Fourth, the first vertically driving member 20 and the second vertically driving member 30 are mounted on the two sliding seats 70 and connected to the two connection bars 43, and the first vertically driving member 20 being positioned above the sensor 50. Finally, the controller 80 is electrically connected to the first vertically driving member 20 and the sensor 50.

In use, the workpiece 200 is dropped or placed in the catching space 413, and makes contact with the contacting portion 534, the contacting portion 534 rotates relative to the mounting body 51 into the second groove 5133, so that a signal is transmitted by the sensor 50, and the first vertically driving member 20, the second vertically driving member 30, and the two horizontally driving members 60 are started or actuated by the controller 80. The horizontally driving members 60 drive the sliding seats 70 to slide along the sliding rods 11, and the first vertically driving member 20 and the second vertically driving member 30 drive the catcher frame 40 to move vertically, such that the workpiece 200 can be moved by the transporting device 100 horizontally and vertically.

Because a center of gravity of the hinge portion 532 is positioned on the side thereof away from the hinge hole 5321 and the contacting portion 534, and the contacting portion 534 protrudes out from the second groove 5133, the workpiece 200 must make contact with the contacting portion 534, and the contacting portion 534 is thus pushed back, into the second groove 5133. Thus, such of the contacting portion 534 is not easily damaged in use, as the weight or impact of a heavy or forcefully moving workpiece 200 is quickly taken or confronted by the mounting body 51 instead of by the contacting portion 534. Working efficiency is thus improved.

In other embodiments, a quantity or total number of the electrodes 53 can be changed, such as one or more than two, and a quantity or total number of the mounting portions 513 are changed accordingly. The second vertically driving member 30 can also be omitted, and only the first vertically driving member 20 drives the catcher frame 40 vertically. The first vertically driving member 20 and the second vertically driving member 30 can be lead screws.

It is to be understood, however, that even through numerous characteristics and advantages of the disclosure have been set forth in the foregoing description, together with details of the structure and function of the embodiments, the disclosure is illustrative only, and changes may be made in detail, especially in the matters of shape, size, and arrangement of parts within the principles of the embodiments to the full extent indicated by the broad general meaning of the terms in which the appended claims are expressed.

What is claimed is:

1. A sensor, comprising:
    a mounting body, the mounting body comprising a main portion and a mounting portion formed on one end of the main portion, a mounting groove being defined in an adjoining portion between the mounting portion and the main portion, the mounting groove comprising a first groove and a second groove, the second groove substantially perpendicularly communicating with the first groove;
    an electrode, the electrode comprising a hinge portion and a contacting portion extending from the hinge portion; and
    a connection member mounted on the main portion; wherein the hinge portion is rotatably connected to the mounting body in the first groove by the connection member, a center of gravity of the hinge portion is positioned on a side thereof away from the contacting portion, and the contacting portion protrudes out from the second groove.

2. The sensor of claim 1, wherein a connection hole is defined in a corner of each side surface of the main portion communicating to the first groove, a mounting hole is defined in the mounting portion communicating to the first groove, the mounting hole and the connection hole are coaxial and opposite to each other, a hinge hole is defined in a corner of the hinge portion adjacent to the contacting portion, the connection member passes through the mounting hole and the hinge hole, and then is fixed in the connection hole, such that the electrode is rotatably connected to the mounting body by the connection member, and the center of gravity of the hinge portion is positioned on a side thereof away from the hinge hole.

3. The sensor of claim 1, wherein the mounting groove is substantially L-shaped.

4. The sensor of claim 1, wherein a connection portion is formed on a side of the main body and the mounting portion, the connection portion, the main body and the mounting portion cooperatively form a stepped structure, the first groove extends toward the connection portion, the second groove substantially perpendicularly communicates to one end of the first groove away from the connection portion.

5. The sensor of claim 1, further comprising an another electrode and an another connection member, the mounting body further comprising an another mounting portion formed on the other end of the main portion, wherein an another mounting groove is defined between the another mounting portion and the main portion.

6. A sensor, comprising:
    a mounting body comprising a main portion and a mounting portion formed on one end of the main portion, a substantially L-shaped mounting groove being defined in an adjoining portion between the mounting portion and the main portion, the mounting groove comprising a first groove and a second groove, the second groove substantially perpendicularly communicating with the first groove;
    an electrode, the electrode comprising a hinge portion and a contacting portion extending from the hinge portion, the hinge portion defining a hinge hole adjacent to the contacting portion; and
    a connection member passing through the mounting portion and the hinge hole, and mounted on the main portion; wherein the hinge portion is rotatably connected to the mounting body in the first groove by the connection member, a center of gravity of the hinge portion is positioned on a side thereof away from the hinge hole and the contacting portion, and the contacting portion protrudes from the second groove.

7. A transporting device for transporting one or more workpieces, comprising:
    a mounting seat comprising a sliding rod;
    a catcher frame mounted on the mounting seat below the sliding rod;
    a horizontally driving member mounted on the sliding rod;
    a sliding seat slidably mounted on the sliding rod and connected to the horizontally driving member;
    a first vertically driving member securely connected to the catcher frame and the sliding seat;

a sensor mounted on the catcher frame, the sensor comprising:
- a mounting body comprising a main portion and a mounting portion formed on one end of the main portion, a mounting groove being defined in an adjoining portion between the mounting portion and the main portion, the mounting groove comprising a first groove and a second groove, the second groove substantially perpendicularly communicating to the first groove;
- an electrode comprising a hinge portion and a contacting portion extending from the hinge portion; and
- a connection member mounted on the mounting portion; wherein the hinge portion is rotatably connected to the mounting body by the connection member in the first groove, a center of gravity of the hinge portion is positioned on a side thereof away from the contacting portion, and the contacting portion protrudes from the second groove; and
- a controller electrically connected to the horizontally driving member, the first vertically driving member and the sensor.

8. The transporting device for transporting one or more workpieces of claim 7, wherein a connection hole is defined in a corner of each side surface of the main portion communicating with the first groove, a mounting hole is defined in each mounting portion communicating with the first groove, the mounting hole and the connection hole are coaxial and opposite to each other, a hinge hole is defined in a corner of the hinge portion adjacent to the contacting portion, the connection member passes through the mounting hole and the hinge hole, and then is fixed in the connection hole, such that each electrode is rotatably connected to the mounting body by one connection member, and the center of gravity of the hinge portion is positioned on a side thereof away from the hinge hole.

9. The transporting device for transporting one or more workpieces of claim 7, wherein the mounting groove is substantially L-shaped.

10. The transporting device for transporting one or more workpieces of claim 7, further comprising an another electrode and an another connection member, the mounting body further comprising an another mounting portion formed on other end of the main portion, wherein an another mounting groove is defined between the another mounting portion and the main portion.

11. The transporting device for transporting one or more workpieces of claim 7, further comprising an another sliding seat and an another horizontally driving member, the mounting seat further comprising an another sliding rod parallel to the sliding rod, the another sliding seat and the another horizontally driving member is mounted on the another sliding rod.

12. The transporting device for transporting one or more workpieces of claim 7, wherein a connection portion is formed on a side of the main body and the mounting portion, and is mounted on the catcher frame, the connection portion, the main body and the mounting portion cooperatively form a stepped structure, the first groove extends toward the connection portion, the second groove substantially perpendicularly communicates with one end of the first groove away from the connection portion.

13. The transporting device for transporting one or more workpieces of claim 12, wherein the catcher frame comprises two opposite support bars and two opposite connection bars, the two support bars and the two connection bars are connected to each other in an end-to-end configuration, and cooperatively forming a catching space, and the connection portion of the sensor is mounted on one of the connection bars.

* * * * *